(12) United States Patent  
Dang et al.

(10) Patent No.: US 7,240,312 B2  
(45) Date of Patent: Jul. 3, 2007

(54) DETECTING SHORT CIRCUITS WITHIN AN INTEGRATED CIRCUIT DESIGN

(75) Inventors: Vincent Dang, Austin, TX (US); Harry A. Levanti, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 175 days.

(21) Appl. No.: 11/086,964

(22) Filed: Mar. 22, 2005

(65) Prior Publication Data

US 2006/0230368 A1 Oct. 12, 2006

(51) Int. Cl.
*G06F 17/50* (2006.01)
*G06F 9/45* (2006.01)

(52) U.S. Cl. ............................................. 716/5; 716/4
(58) Field of Classification Search ................ 716/1–5, 716/18
See application file for complete search history.

(56) References Cited

U.S. PATENT DOCUMENTS

| 6,380,593 | B1* | 4/2002 | Maxey et al. ............... 257/371 |
| 6,507,932 | B1 | 1/2003 | Landry et al. ................. 716/3 |
| 6,553,542 | B2* | 4/2003 | Ramaswamy et al. ......... 716/2 |
| 6,799,307 | B1 | 9/2004 | Lipton et al. .................. 716/5 |
| 6,986,113 | B2* | 1/2006 | Sinha et al. ................... 716/4 |
| 7,149,989 | B2* | 12/2006 | Lakshmanan et al. ......... 716/5 |
| 2002/0122280 | A1* | 9/2002 | Ker et al. ..................... 361/56 |

OTHER PUBLICATIONS

Smedes et al., Extraction of Circuit Models for Substrate Cross-talk, 1995, IEEE/ACM, pp. 199-206.*
U.S. Appl. No. 10/902,233, filed Jul. 29, 2004, entitled "Integrated Circuit Having Features to Limit Substrate Current".
Cadence: Layout Versus Schematic (LVS) Verification. http://www.seas.upenn.edu/~eecad/cadence/lvs.html. Mar. 15, 2003.

* cited by examiner

*Primary Examiner*—Jack Chiang
*Assistant Examiner*—Nghia M. Doan
(74) *Attorney, Agent, or Firm*—Trop, Pruner & Hu, P.C.

(57) ABSTRACT

In one embodiment, the present invention includes a method for obtaining a physical layout for an integrated circuit (IC) design of a substrate having at least one of an n-well and a deep n-well; and extracting a layout netlist for the IC design from the physical layout by identifying the substrate as a single region. In such manner, short circuits isolated by the n-well or the deep n-well can be detected.

18 Claims, 4 Drawing Sheets

DETECTING SHORT CIRCUITS WITHIN AN INTEGRATED CIRCUIT DESIGN

FIELD OF THE INVENTION

The present invention relates to integrated circuits (ICs), and more particularly to tools used in the design and development of ICs.

BACKGROUND

The design and development of an integrated circuit is an expensive and time-consuming process, during which many different activities, from product definition to design to layout verification and simulation are performed, all prior to fabrication of a prototype IC. To verify operability of a layout and permit optimizations or changes, and to reduce potential defects within an IC, after a layout is created a layout versus schematic (LVS) verification process may occur. Such a process is used to compare a layout version of the IC to a schematic version of the IC to determine correspondence between the two versions.

Software tools are available for LVS verification. These tools typically compare the connectivities of an IC layout with the connectivities of a schematic of the IC to verify a one-to-one correspondence. That is, an IC design may be represented by an electrical schematic containing devices and nets interconnecting the devices together, and by geometric layout data that describes patterns of regions or elements to be formed in and/or on an integrated circuit substrate (e.g., a wafer).

Tools to perform layout versus schematic comparisons may include extraction software to extract a layout netlist from geometric layout data. The extracted layout netlist can then be compared to an electrical schematic netlist to determine functional equivalence between the schematic and the layout.

In an analog IC, a layout typically includes a number of different cells, each having different functionalities. Furthermore, various cells may operate using different supply voltages. In other words, the different cells operate at different supply voltage domains. Inherent in the provision of different supply voltages is the risk of shorting two or more of the supplies together.

To provide protection between different cells operating at different supply domains, analog ICs often include different regions to isolate one cell (and accordingly one supply voltage domain) from another. Furthermore, the operation of an analog IC may produce electrical activity that spans a wide frequency spectrum, including the radio frequency (RF) range, which has a tendency to generate a significant level of substrate current if no measures are taken to limit this current.

Thus for these reasons, active devices within an analog IC design are typically formed inside protected regions of a substrate on which the IC is formed. For example, an n donor-type region (called a "deep n-well") of a p donor-type substrate can provide a degree of isolation between the devices and the substrate, and maintain isolation between cells operating at different voltages. Other well regions can also be present in a design, such as n-wells that form a ring around one or more cells operating at a given supply voltage.

When modeling these well regions of an IC during a LVS verification process, it is possible for short circuits isolated by these regions, among other such structures, to not be detected. If these short circuits are not detected during the LVS process, a design flaw causing the short circuit can remain in the layout. Thus when prototype ICs are fabricated, they will have the short circuit causing additional expense and delay in debugging and correcting the short circuit.

A need thus exists to more effectively verify an IC design.

SUMMARY OF THE INVENTION

In one embodiment, the present invention includes a method of obtaining a physical layout for an integrated circuit (IC) design of a substrate that includes a first well and a deep well and extracting a layout netlist of the IC design from the physical layout by identifying the substrate as a single region. That is, even portions of the substrate under the first well and the deep well are identified as a single region along with other portions of the substrate. Using the layout netlist, a layout versus schematic (LVS) verification process may proceed. In such manner, short circuits between different locations of the substrate underlying, for example, the first well and the deep well may be detected during the LVS process. The layout netlist may thus be extracted by applying a three-dimensional connection model of the IC design, more accurately representing the physical reality of the IC design than conventional methods.

In another embodiment, a method may include obtaining a schematic netlist of an IC design that includes an n-well and a deep n-well formed on a substrate, and obtaining a physical layout for the IC design. Based on the physical layout, the substrate may be defined as a single region that includes the area under the n-well and the deep n-well. This definition may be implemented within one or more software routines used in extracting a layout netlist of the IC design. These routines may further define contacts between various structures to be formed on the substrate based on their physical location (e.g., as being defined to be within a structure in which the contact is to be formed), and then connect these contacts based on the physical location. Then, using the layout netlist and the schematic netlist, a LVS process may occur.

Still other embodiments may be realized as a storage medium containing instructions that may be used in a LVS process. These instructions may cause a tool, such as a software tool, to obtain a physical layout for a mixed signal IC design of a substrate having a first well that is to receive a first supply voltage and a deep well, and to extract a layout netlist of the mixed signal IC design from the physical layout by identifying the substrate as a single region. In some embodiments, the instructions may further define a retro well contact that is to receive a second supply voltage to be located over a retro well, where the retro well is surrounded by multiple wells and formed in the deep well. The instructions may further connect the defined retro well contact to the retro well. Embodiments of the present invention may be implemented in appropriate hardware, firmware, and software.

DETAILED DESCRIPTION

Figure 1:
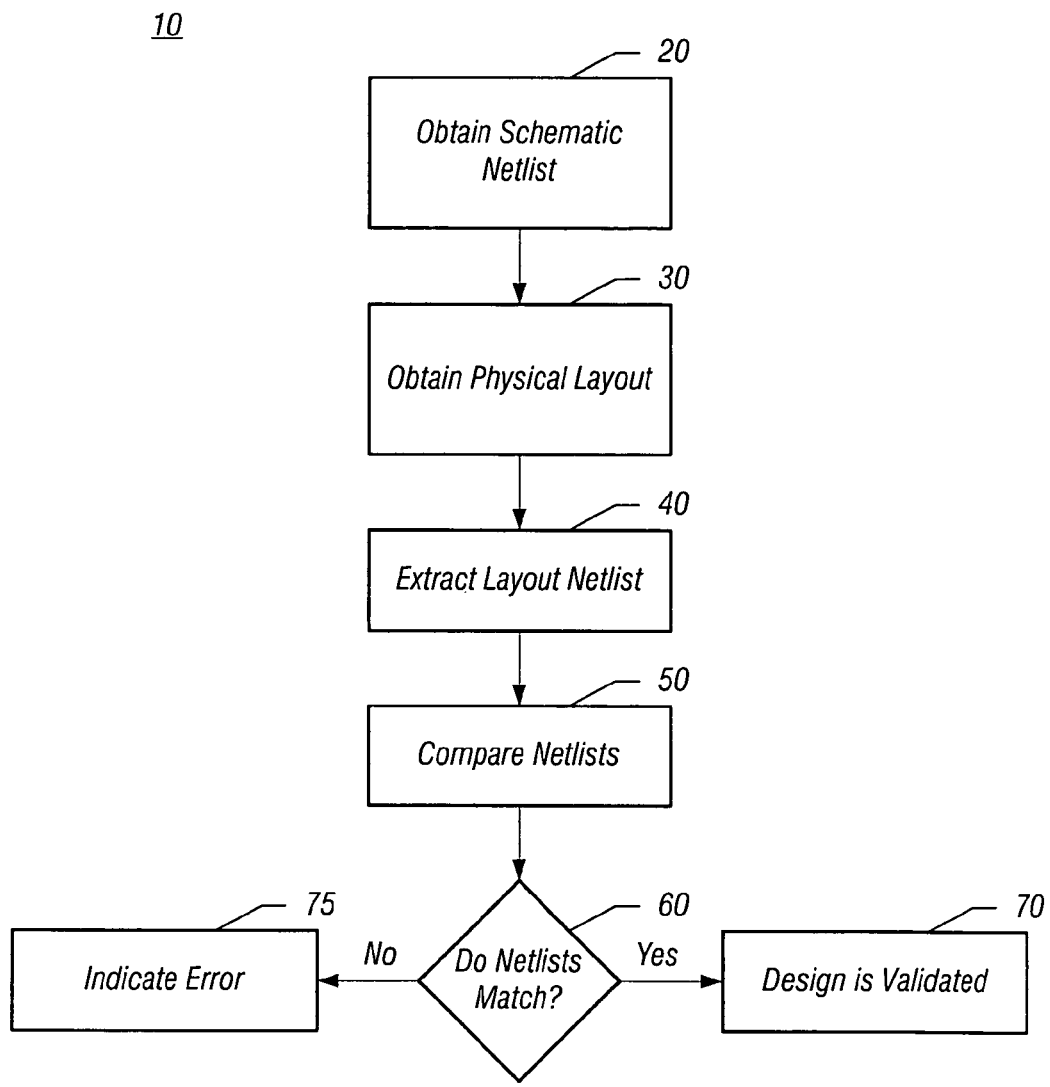
FIG. 1 is a flow diagram of a method in accordance with one embodiment of the present invention.

Referring to FIG. 1, shown is a flow diagram of a method in accordance with one embodiment of the present invention. In various embodiments, the method may be implemented using a software tool. As shown in FIG. 1, method 10 may be used to perform LVS verification of an IC design. Method 10 may begin by obtaining a schematic netlist (block 20). Such a schematic netlist may be obtained from a schematic layout of the IC design.

Next, a physical layout may be obtained (block 30). Such a physical layout may be obtained from a layout of the IC design. From the physical layout, a layout netlist may be extracted (block 40). In various embodiments, a series of instructions (i.e., a computer program) may be generated that are used to perform the extraction of a layout netlist from the physical layout. Then, the schematic netlist may be compared to the layout netlist (block 50). That is, each cell of the IC design may in turn have its schematic netlist compared to its layout netlist to determine whether the netlists match (diamond 60). Thus in some embodiments, the comparison may be done on a cell-by-cell basis. If the cells match, the design is validated (block 70). If the design is validated, the IC design may be used to fabricate ICs, for example, prototype chips. Alternately if there are any mismatches, an error is indicated (block 75). If errors are identified, debug and redesign steps may occur, avoiding the costly and time-consuming fabrication of ICs with such errors.

While different manners of extracting a layout netlist may be effected, in various embodiments a layout netlist may be efficiently extracted by identifying the entire substrate as a single region for purposes of the layout extraction.

Figure 2:
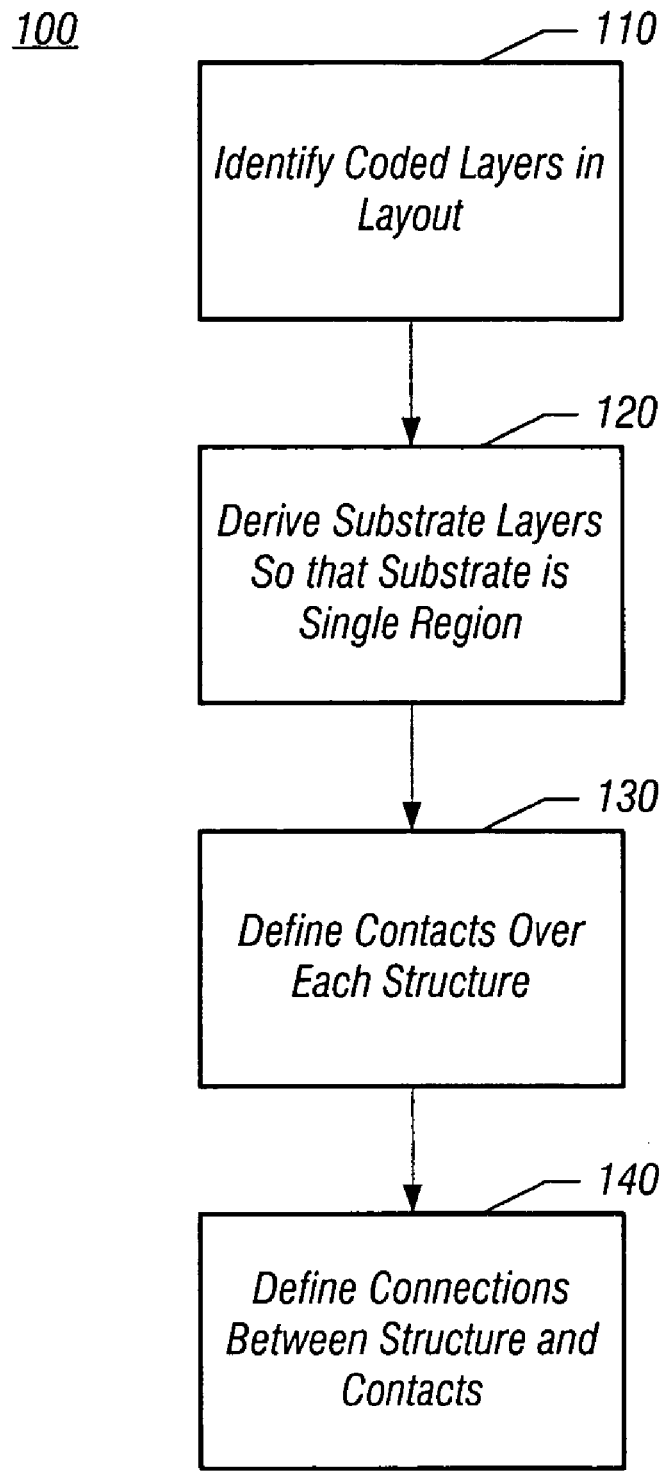
FIG. 2 is a flow diagram of a layout extraction method in accordance with another embodiment of the present invention.

Referring now to FIG. 2, shown is a flow diagram of a layout extraction method in accordance with one embodiment of the present invention. As shown in FIG. 2, method 100 may be used to extract a layout netlist from a layout. First, coded layers in the layout may be identified (block 110). That is original layers, such as n-wells or deep n-wells in the layout may be identified. Further discussion of such wells and their use in an IC design is set forth below in regard to FIGS. 3 and 4.

From the coded layers, a substrate layer may be derived (block 120). More specifically, the substrate layer may be derived such that the substrate is defined to be a single region. That is, even portions of the substrate under well structures, such as n-wells and deep n-wells, may all be considered a single region. In one embodiment, the single region may be derived by not performing any logical operations between the substrate and the well regions, as will be described further below.

Next, contacts may be defined over each structure (block 130). For example, contacts to receive different voltage levels for different parts of the IC may be defined. As described above, these contacts can be shorted to the structures to which they connect or to other parts of the IC. Theses contacts may be defined by the material and manner in which they are formed, in addition to their location with respect to well structures.

Finally, connections may be defined between the structures and the contacts defined above (block 140). In such manner, the contacts may be represented as electrically connected to the appropriate structures to which they are connected. Accordingly, detection of shorts in these contacts that would otherwise be undetectable during an LVS verification process can occur.

In such manner, extraction of a layout netlist in accordance with an embodiment of the present invention may better reflect the electrical reality of an IC design. More so, the extraction may effect a three-dimensional (3D) connection model for the design. This 3D connection model, in combination with defining the substrate as a single region, may detect otherwise undetectable short circuits during an LVS verification process.

Figure 3:
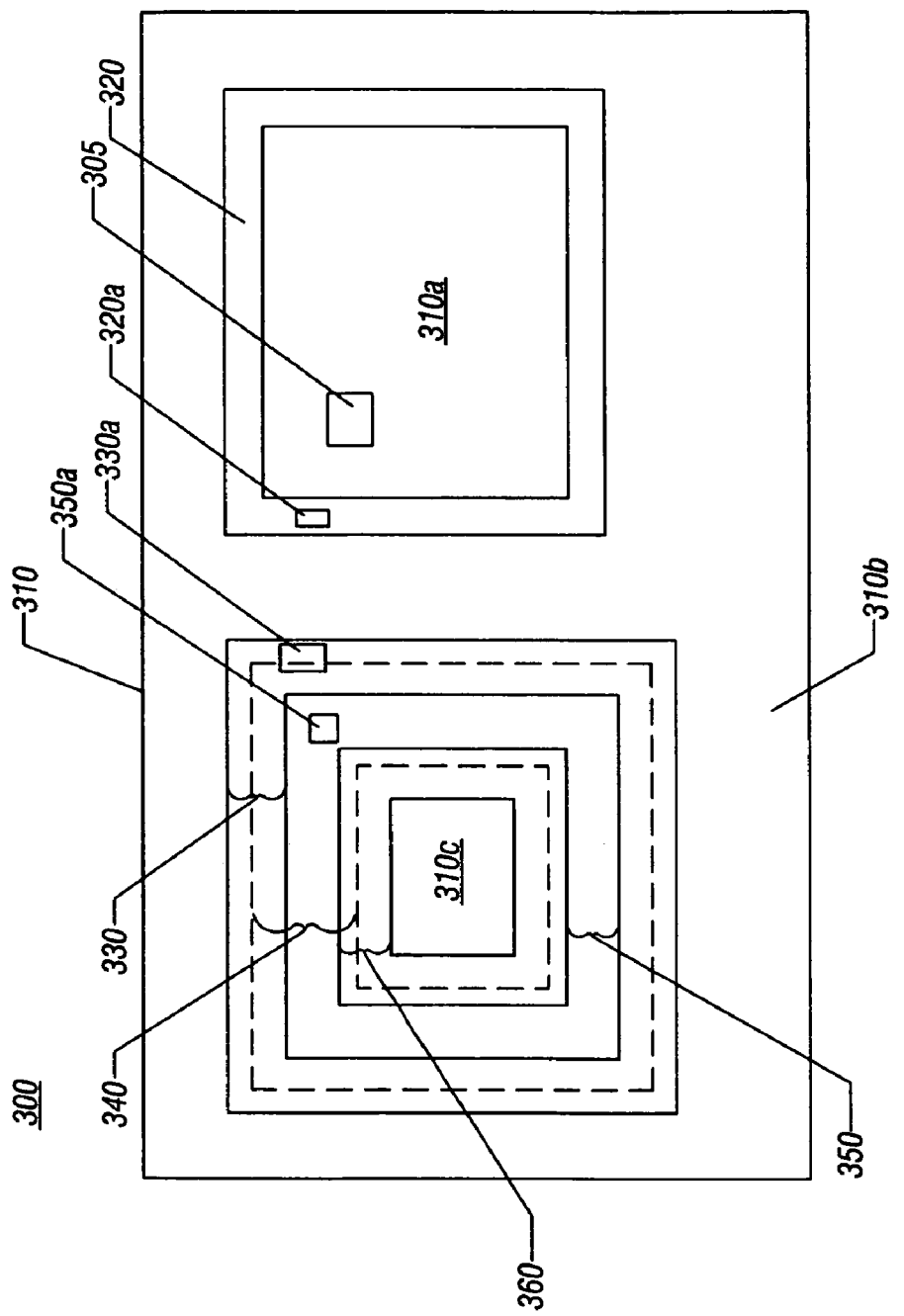
FIG. 3 is a top view of an integrated circuit design according to an embodiment of the present invention.

Referring now to FIG. 3, shown is a top view of an integrated circuit 300 according to one embodiment of the present invention. While FIG. 3 shows only a portion of an IC, it is to be understood that additional portions of the IC may include additional circuitry and structures. As an example, the portion of IC 300 shown in FIG. 3 may correspond to analog circuitry of a mixed signal IC that may operate using different supply voltages for different portions of the circuit. Accordingly, each portion operating using a different supply voltage may have a contact to receive the intended supply voltage for that portion.

As shown in FIG. 3, IC 300 is formed on a substrate 310, which maybe a p-donor-type substrate (a p substrate). IC 300 may include various structures to isolate different portions of the circuitry from each other. For example, different structures are formed on certain parts of the substrate, including an n donor-type region that forms an n-well 320. N-well 320 forms an island structure in substrate 310. When it wraps around to electrically connect to itself and encloses a portion of substrate 310 (referenced in FIG. 3 as 310a), it may be referred to as an n-well ring (note the terms "n-well" and "n-well ring" are used interchangeably). While not shown in the embodiment of FIG. 3, it is to be understood that various devices may be formed within the island portion 310a of substrate 310 inside of n-well 320. Also shown within the island portion 310a of substrate 310 is a contact 305. Contact 305 may be used to receive a supply voltage for circuitry within the island portion 310a of substrate 310, for example. Similarly, n-well 320 includes an electrical contact 320a, for example, to receive a supply voltage for n-well 320.

As further shown in FIG. 3, substrate 310 includes a portion 310b located outside of given structures on substrate 310. Furthermore, substrate 310 includes additional structures including a pair of additional n-wells 330 and 360. As shown in FIG. 3, n-wells 330 and 360 isolate an additional portion 310c of substrate 310. While not shown in the embodiment of FIG. 3, it is to be understood that various devices may be formed within the island portion 310c of substrate 310 within n-wells 330 and 360. Furthermore, a deep n-well 340 is formed between n-wells 330 and 360. The combination of deep n-well 340 and n-wells 330 and 360 may be referred to as a deep n-well ring structure. The actual structures of FIG. 3 are shown more clearly in the cross-sectional view of FIG. 4, as will be discussed below. As further shown in FIG. 3, a retrowell 350 is formed between n-wells 330 and 360. Retrowell 350 formed above deep n-well 340 is electrically isolated from substrate 310 via n-wells 330 and 360 and deep n-well 340. While retrowell 350 is isolated from substrate 310, island portion 310c of substrate 310 is electrically connected to substrate 310b outside the deep n-well ring structure.

Also shown in FIG. 3, various contacts may be made in the different portions of the circuitry to provide electrical connections to, for example, supply voltages. For example, retrowell 350 includes a retrowell contact 350a and n-well 330 includes an n-well contact 330a. While shown with specific contacts in FIG. 3, in other designs different configurations of contacts (and well regions) are possible.

As seen in FIG. 3 (and further in FIG. 4 below), the different portions of substrate 310, including substrate portions 310a, 310b and 310c are electrically the same. However, these substrate portions 310a, 310b, and 310c are electrically isolated from retrowell 350. Embodiments of the present invention may be used to detect shorts from, for example, substrate portion 310a to substrate portion 310b and/or shorts from substrate portion 310b to substrate portion 310c. Conventional methods cannot determine or detect the presence of such shorts.

Figure 4:
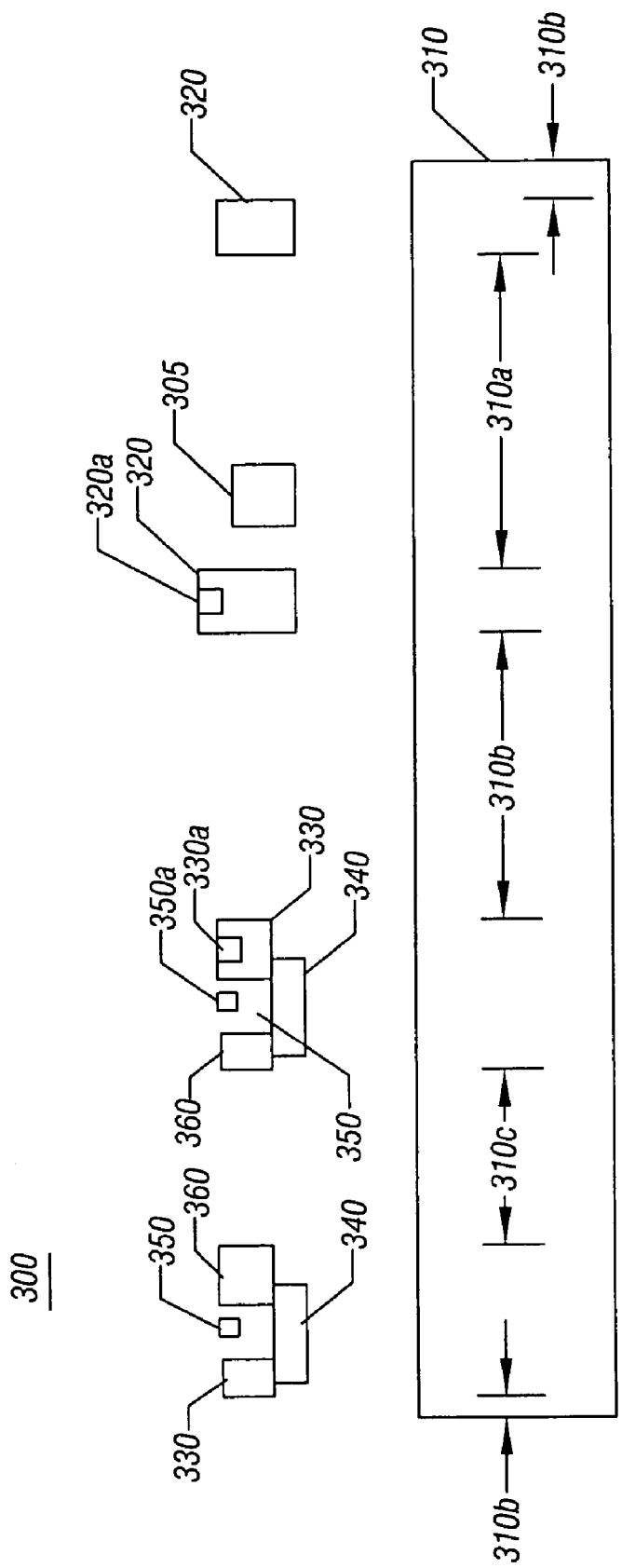
FIG. 4 is a cross-sectional view of the integrated circuit design of FIG. 3.

Referring now to FIG. 4, shown is a cross section of the IC design of FIG. 3. More specifically, the cross section of FIG. 4 represents the physical reality of a circuit, in that various layers formed on a substrate are shown as lying above the substrate, although one or more of the layers may actually be diffused or implanted into substrate 310. In such manner, the cross section of FIG. 4 reflects the electrical reality that the structures in FIG. 3 are not truly isolated from each other, in that electrical currents may flow under the structures as readily seen in the cross section of FIG. 4. As shown in FIG. 4, the different portions of substrate 310, represented by the dashed lines in FIG. 4 indicating portions 310a, 310b and 310c are thus electrically the same.

Thus as shown in FIG. 4, various structures of FIG. 3 are shown as being located above the surface of substrate 310, although in fact one or more of the structures may be diffused or implanted into substrate 310. On the right side of FIG. 4, shown is a cross section of n-well ring 320. The left portion of n-well ring 320 includes n-well contact 320a, which is formed of n-type material diffused into n-well 320. Similarly, substrate contact 305 is a p-type material diffused into substrate 310, although it is also shown as being above substrate 310.

Referring to the left side of FIG. 4, deep n-well 340 is shown above substrate 310, although it is to be understood that in some embodiments deep n-well 340 may be formed by implanting or diffusing n-type material into substrate 310. Furthermore, n-wells 330 and 360 are shown as being formed on deep n-well 340. However, it is to be understood that such wells may be at least partially formed within n-well 340. Similarly, retrowell 350, which may be a p-type material, may be formed in n-wells 330 and 360 and above deep n-well 340.

As also shown in FIG. 4, a retrowell contact 350a is formed on retrowell 350 and an n-well contact 330a is formed within n-well 330. As previously described, these contacts may be implanted or diffused into the wells in order to provide electrical contact with the wells.

While shown with the specific layout in the embodiment of FIGS. 3 and 4, it is to be understood the scope of the present invention is not so limited, and the LVS techniques disclosed herein may be implemented with any desired circuit structure. By using the LVS techniques disclosed herein, shorts isolated by various structures of an IC, such as n-wells, deep n-wells and the like may be detected, allowing an incorrect IC design to be remedied prior to manufacture.

Referring now to Table 1 below, shown is an example code portion in accordance with one embodiment of the present invention. Specifically, the code may correspond to extraction code used to extract a physical layout from IC design 300 of FIGS. 3 and 4. More specifically, the code includes statements to define various structures of the substrate, as well as the substrate itself in light of original or coded layers.

TABLE 1

```
// NWELL    Original layer or coded layer
// DNW      Original layer or coded layer
// tndiff   n diffusion, is the derived layer
// tpdiff   p diffusion, is the derived layer
nxwell   = NWELL NOT NWDMY   // NWELL that is not resistor.
nw_all   = NWELL OR DNW
psubb    = EXTENT of layout   // psubb is the substrate underneath
                                nwell and DNW
rwella   = holes NWELL
rwellb   = rwella AND DNW     // Form a rwell
rwell    = rwellb NOT NWELL   // Remove NWELL inside DNW
// Define all the contacts
nplug    = tndiff INSIDE nxwell
pplug    = tpdiff OUTSIDE nw_all
rwplug   = tpdiff INSIDE rwell
SCONNECT tndiff nxwell BY nplug
SCONNECT tpdiff psubb BY pplug
SCONNECT tpdiff rwell BY rwplug
```

Referring to Table 1, the original or coded layers include n-well regions and deep n-well regions (shown in Table 1 as NWELL and DNW). With reference to FIGS. 3 and 4, these original layers correspond to wells 320, 330, and 360 (for NWELL) and well 340 (for DNW). The definitional statements in Table 1 include a statement to define n-well regions as original n-well layers that are not resistors (i.e., nxwell=NWELL NOT NWDMY). Furthermore, Table 1 includes a statement to define all n-well and deep well regions as a derived layer (i.e., nw_all=NWELL OR DNW).

Next, Table 1 includes a statement to define the substrate as a single region. Specifically, from coded layers the substrate is defined as the extent of the physical layout (i.e., $p_b$=EXTENT of layout). That is, the substrate as defined includes the structures formed on it, including the n-well regions and deep n-well regions. As seen in Table 1, there are no logical operations present to divide these n-well regions or deep n-well regions from the substrate (e.g., via a NOT operation).

Next, Table 1 includes statements to define various regions of the IC. Specifically, regions may be defined to be the island within n-well 320 and n-well 360 (i.e., rwella=holes NWELL). Furthermore, a region forming retrowell 350 may be defined. First, a region including retrowell 350 and deep n-well 340 may be defined (i.e. rwellb=rwella AND DNW). Then, the portion of retrowell 350 that does not overlap with n-wells 330 and 360 may be defined (i.e., rwell=rwellb NOT NWELL).

Still referring to Table 1, the code defines the contacts as being diffusions (e.g., an n-type diffusion (tndiff) and p-type diffusion (tpdiff)) located within certain derived layers or structures. For example, n-well contact 330a is defined to be in n-well 330 (i.e., nplug=tndiff INSIDE nxwell). Similarly, substrate contact 310 is defined to be outside all well structures (i.e., pplug=tpdiff OUTSIDE nw_all). Finally, retrowell contact 350a is defined to be within retrowell 350 (i.e., rwplug=tpdiff INSIDE rwell).

Still referring to Table 1, next the contacts may be defined to be connected to the various structures in which they are formed. Thus as shown in Table 1, n-well contact 330a is connected to n-well 330, substrate contact 310a is connected to substrate 310, and retrowell 350a is connected to retrowell 350 (i.e., the various SCONNECT statements in Table 1).

Accordingly, connections between the contacts and the structures in which they are formed can be determined. More so, proper electrical connections may be extracted and used in a LVS tool to compare to a schematic netlist in order to detect any shorts in these contacts.

In various embodiments, code to extract a layout netlist may be implemented using software (or a combination of software, firmware and hardware) that may be executed within a system, such as a computer system or other device running semiconductor design tools. Such embodiments may include an article in the form of a machine-readable storage medium onto which there are stored instructions and data that form a software program to perform such methods.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    obtaining a physical layout for an integrated circuit (IC) design of a substrate having of a first well to receive a supply voltage and a deep well;
    extracting a layout netlist of the IC design from the physical layout by applying a three dimensional connection model and identifying the substrate as a single region including area under the first well and the deep well;
    performing a layout versus schematic (LVS) verification using the layout netlist and a schematic netlist obtained from a schematic layout of the IC design; and
    detecting a short circuit during the LVS verification, the short circuit present in the IC design and located in the single region that is isolated by the first well or the deep well.

2. The method of claim 1, wherein extracting the layout netlist further comprises defining a substrate contact over the substrate and connecting the defined substrate contact to the substrate.

3. The method of claim 1, wherein the IC design includes a retro well surrounded by the first well and a second well and formed above the deep well.

4. The method of claim 3, wherein extracting the layout netlist further comprises defining a retro well contact over the retro well and connecting the defined retro well contact to the retro well.

5. The method of claim 1, further comprising defining the substrate including the first well and the deep well using an EXTENT operation to identify the substrate as the single region.

6. The method of claim 1, wherein the three-dimensional connection model physically represents the IC design.

7. A method comprising:
    obtaining a schematic netlist of an integrated circuit (IC) design, the IC design including an n-well to receive a supply voltage and a deep n-well formed on a substrate;
    obtaining a physical layout for the IC design;
    defining the substrate as a single region, the single region including area under the n-well and the deep n-well;
    extracting a layout netlist of the IC design from the physical layout using the defined substrate a three dimensional connection model; and
    determining whether the IC design includes one or more short circuits between different portions of the single region by performing a layout versus schematic (LVS) verification using the schematic netlist and the layout netlist.

8. The method of claim 7, wherein extracting the layout netlist further comprises defining an n-well contact to be inside the n-well.

9. The method of claim 8, wherein extracting the layout netlist further comprises connecting the n-well contact to the n-well.

10. The method of claim 7, wherein extracting the layout netlist further comprises defining a substrate contact to be formed in the substrate and to be outside of the n-well and the deep n-well.

11. The method of claim 10, wherein extracting the layout netlist further comprises connecting the substrate contact to the substrate.

12. The method of claim 7, wherein extracting the layout netlist further comprises defining a retrowell to be formed between a pair of n-well rings and over a deep n-well.

13. The method of claim 12, wherein extracting the layout netlist further comprises defining a retrowell contact to be inside the retrowell.

14. The method of claim 13, wherein extracting the layout netlist further comprises connecting the retrowell contact to the retrowell.

15. An article comprising a machine-accessible storage medium containing instructions that if executed enable a system to:
    obtain a physical layout for a mixed signal integrated circuit (IC) design of a substrate having a first well to receive a first supply voltage and a deep well;
    extract a layout netlist of the mixed signal IC design from the physical layout using a three dimensional connection model by identifying the substrate as a single region including area under the first well and the deep well;
    perform a layout versus schematic (LVS) verification using the layout netlist and a schematic netlist obtained from a schematic layout of the IC design: and
    detect a short circuit present in the single region of the IC design that is isolated by the first well or the deep well, the short circuit detected during the LVS verification.

16. The article of claim 15, further comprising instructions that if executed enable the system to define a retro well contact to receive a second supply voltage over a retro well surrounded by the first well and a second well and formed above the deep well and connect the defined retro well contact to the retro well.

17. The article of claim 15, further comprising instructions that if executed enable the system to define the substrate including the first well and the deep well using an EXTENT operation to identify the substrate as the single region.

18. The article of claim 15, wherein the three-dimensional connection model physically represents the IC design.

* * * * *

UNITED STATES PATENT AND TRADEMARK OFFICE
CERTIFICATE OF CORRECTION

| | | |
|---|---|---|
| PATENT NO. | : 7,240,312 B2 | Page 1 of 1 |
| APPLICATION NO. | : 11/086964 | |
| DATED | : July 3, 2007 | |
| INVENTOR(S) | : Vincent Dang and Harry A. Levanti | |

It is certified that error appears in the above-identified patent and that said Letters Patent is hereby corrected as shown below:

Column 7:
Line 18, "having of a first" should be --having a first--.

Signed and Sealed this

Twenty-eighth Day of August, 2007

JON W. DUDAS
*Director of the United States Patent and Trademark Office*